United States Patent [19]

Bergemont

[11] Patent Number: 5,379,253
[45] Date of Patent: * Jan. 3, 1995

[54] HIGH DENSITY EEPROM CELL ARRAY WITH NOVEL PROGRAMMING SCHEME AND METHOD OF MANUFACTURE

[75] Inventor: Albert Bergemont, Santa Clara, Calif.

[73] Assignee: National Semiconductor Corporation, Santa Clara, Calif.

[*] Notice: The portion of the term of this patent subsequent to Mar. 8, 2011 has been disclaimed.

[21] Appl. No.: 891,705

[22] Filed: Jun. 1, 1992

[51] Int. Cl.$^6$ .................................. H01L 29/68
[52] U.S. Cl. ................... 365/185; 257/321; 257/315; 257/346; 437/52; 437/43
[58] Field of Search ............... 365/185; 257/321, 389, 257/346, 366, 381, 312, 313, 314, 315, 316, 317; 437/52, 43

[56] References Cited

U.S. PATENT DOCUMENTS

| | | | |
|---|---|---|---|
| 4,258,466 | 3/1981 | Kuo et al. | 29/571 |
| 4,947,222 | 8/1990 | Gill et al. | 257/321 |
| 4,979,005 | 12/1990 | Mitchell | 365/184 |
| 5,012,307 | 4/1991 | Gill et al. | 365/185 |
| 5,051,796 | 9/1991 | Gill | 257/316 |
| 5,057,886 | 10/1991 | Riemenschneider et al. | 257/317 |
| 5,156,990 | 10/1992 | Mitchell | 257/402 |

FOREIGN PATENT DOCUMENTS

| | | | |
|---|---|---|---|
| 57-106079 | 10/1982 | Japan . | |
| 0436156 | 7/1991 | Japan | 365/185 |
| 2073488A | 10/1981 | United Kingdom . | |
| WO909/116-21 | 10/1990 | WIPO . | |

OTHER PUBLICATIONS

Boaz Eitan, R. Kazerounian and A. Bergemont, "Alternate Metal Virtual Ground (AMG)—A New Scaling Concept for Very High–Density EPROM's", IEEE Electron Device Letters, vol. 12, No. 8, Aug. 1991, New York, U.S., pp. 450–451.

*Primary Examiner*—Eugene R. LaRoche
*Assistant Examiner*—Vu Le
*Attorney, Agent, or Firm*—Limbach & Limbach

[57] ABSTRACT

A high density, electrically-erasable programmable read-only memory (EEPROM) cell is fabricated and used. Forming field oxide regions (FOX1) in a P-well defines a p-type active device region. Forming N+ buried bit lines in the substrate adjacent to the FOX1 regions defines a P-channel region. Forming additional field oxide regions (FOX2) adjacent to the FOX1 regions covers the bit lines. A gate oxide layer is formed between the FOX2 regions, upon which a tunnel oxide window is defined. A polysilicon layer covers the gate oxide and forms the floating gate for the cell. An oxide/nitride/oxide (ONO) layer covers the floating gate. A polysilicon/tungsten silicide layer covers the ONO defining the control gate for the cell. The cell is programmed by simultaneously holding the control gate (word line) at a high programming voltage, the bit lines at a low supply voltage, and the P-well at ground; while the word lines of adjacent cells having the same bit lines are grounded, and while the bit lines of adjacent cells having the same word line are held at the programming voltage. The cell is erased by simultaneously holding the control gate (word line) at a low supply voltage, the bit lines at the programming voltage, and the P-well at the programming voltage; while the word lines of adjacent cells having the same bit lines and the bit lines of adjacent cells having the same word line are all held at the programming voltage.

18 Claims, 6 Drawing Sheets

HIGH DENSITY EEPROM CELL ARRAY WITH NOVEL PROGRAMMING SCHEME AND METHOD OF MANUFACTURE

RELATED APPLICATIONS

This application is related to the following two applications which are commonly assigned with this application to National Semiconductor Corporation and are both filed of even date herewith: (1) U.S. patent application Ser. No. 07/891,710, filed by Albert Bergemont for HIGH DENSITY EEPROM CELL WITH POLY TUNNEL SPACER and (2) U.S. patent application Ser. No. 07/891,764, filed by Michael Hart et al. for HIGH DENSITY EEPROM CELL WITH TUNNEL OXIDE STRIPE. Both of the aforementioned related applications are hereby incorporated by reference to provide additional background information regarding the present invention.

BACKGROUND OF THE INVENTION

1. Field of the Invention

The present invention relates to high density electrically erasable programmable read only memory (EEPROM) devices and, in particular, to an EEPROM cell array that is fabricated over a P-well and utilizes a novel programming/erasing scheme to avoid disturbing adjacent cells.

2. Discussion of the Prior Art

The basic, fundamental challenge in creating an electrically-erasable programmable read only memory (EEPROM) cell is to use a controllable and reproducible electrical effect which has enough nonlinearity so that the memory cell can be written or erased at one voltage in less than 1 ms and can be read at another voltage, without any change in the programmed data for more than 10 years. Fowler-Nordheim tunneling, which was first described by Fowler and Nordheim in 1928, exhibits the required nonlinearity and has been widely used in EEPROM memories.

In silicon (Si), the energy difference between the conduction band and the valence band is 1.1 eV. In silicon dioxide ($SiO_2$), the energy difference between these bands is about 8.1 eV, with the conduction band in $SiO_2$ 3.2 eV above that in Si. Since electron energy is about 0.025 eV at thermal room temperature, the probability that an electron in Si can gain enough thermal energy to surmount the Si-to-$SiO_2$ barrier and enter the conduction band in $SiO_2$ is very small. If electrons are placed on a polysilicon floating gate surrounded by $SiO_2$, then this band diagram will by itself insure the retention of data.

Fowler-Nordheim emission, which was observed early in this century for the case of electron emission from metals into vacuums, was also observed by Lenzliger and Snow in 1969 for electron emission from silicon to silicon dioxide. In the presence of a high electric field at the Si-$SiO_2$ interface, the energy bands will be distorted and there is a small, but finite, probability that an electron in the conduction band of the Si will quantum mechanically tunnel through the energy barrier and emerge in the conduction band of the $SiO_2$.

The tunneling current increases exponentially with the applied field in accordance with the following general current density expression:

$$J = (AE^2)\exp(-B/E)$$

where A and B ar constants, and

E is the field at the Si-$SiO_2$ interface

This current is observable at a current density of 10E-6 A/cm2 when the field at the Si-$SiO_2$ interface is about 10 MV/cm. Local fields of this magnitude, at voltages practicable for use in microelectronics, can be obtained by applying a voltage across either a thin (about 100 Å) oxide grown on bulk silicon or across thicker (about 500 Å) oxide grown on polysilicon. In the latter case, the field enhancement arises from textured polysilicon formation, i.e. positive curvature regions at the polysilicon-polysilicon oxide interface resulting in tunneling enhancement at similar voltages as in the first case.

The theoretically ideal EEPROM memory cell comprises a single transistor addressable by applying electrical signals to a specified row and a specified column of the memory array matrix. For example, to write a logic "1" or a logic "0" into a cell of this "ideal" cell, a voltage is applied to the control gate corresponding to the row (word line) of the selected cell while a voltage corresponding to either a "1" or a "0" is applied to the source or drain corresponding to the column (bit line) of the selected cell.

An important problem encountered in attempts to realize this "ideal" cell is the need for an additional access transistor in each memory cell to enable selection of a single row of memory cells while changing data in the selected cell without accidentally writing or erasing memory in other rows. Unfortunately, the presence of an additional access transistor in each memory cell increases the size of the cell and leads to impractical die size for high density Megabit memory arrays.

It is, therefore, a goal to provide an EEPROM cell which does not require an additional distinct access transistor in each memory cell to provide reliable selection of a single cell for changing data while precluding accidental simultaneous programming or erasure in non-selected cells.

The basic concept of the well-known FLOTOX EEPROM memory cell is shown in FIG. 1. In the FLOTOX cell, the tunnel oxide, which typically is less than 100 Å thick, is grown over an area defined photolithographically in the drain region (or an extension of the drain region, called buried N+). Charging of the floating gate to program the cell is achieved by grounding the source and the drain and applying a high voltage to the control gate. The FLOTOX cell is designed such that a large fraction of the applied voltage is coupled across the tunnel oxide resulting in the transport of electrons from the drain to floating gate. Discharge of the floating gate to erase the cell is achieved by grounding the control gate, floating the source and applying a high voltage to the drain. In this case, most of the applied voltage is coupled across the tunnel oxide, but the field is reversed, resulting in tunneling of electrons from the floating gate to the drain. The source is floated so that there is no continuous current path, an important factor when an internal charge pump is used to generate the high voltage from a $\leq 5$ V supply.

If a single transistor memory cell is placed in a typical array with drains connected to metal columns and gates connected to common polysilicon word lines, the erasing of the cell, with the word line grounded, will mean that high voltage is applied to all drains in a common column. Erasing can be inhibited in non-selected cells by taking unselected word lines to a high voltage. However, this means that unselected cells along the same word line may be programmed. To avoid such disturb conditions, as shown in FIG. 1, the FLOTOX cell utilizes a distinct access transistor to isolate the drain from the column bit line. The access transistor is off for rows that are not selected.

FIG. 2 provides a layout of the FIG. 1 FLOTOX cell, with the FIG. 1 cross section being taken perpendicular to the word line (control gate) and through the tunnel oxide window.

E. K. Shelton, "Low-power EE-PROM can be reprogrammed fast", Electronics, Jul. 31, 1980, pp. 89–92, discloses a basic EEPROM concept similar to the above-described FLOTOX concept. However, as shown in FIG. 3, instead of a tunnel oxide area defined lithographically over the drain (buried N+), the Shelton cell has its tunnelling area defined in the channel under the polysilicon floating gate. The polysilicon floating gate partially spans the drain side of the channel, while the remainder of the channel (source side) is spanned by an overlying aluminum control gate. The aluminum control gate is insulated from the polysilicon floating gate by a thin silicon nitride layer.

Furthermore, the Shelton memory cell is formed in a P-well on a N-substrate. Controlling the P-well potential allows the elimination of the distinct access transistor in each memory cell. The potential of the P-well and the sources and drains of the unselected cells are chosen during programming operations to prevent minority carriers from discharging any of the floating gates to the substrate while permitting an individual selected floating gate to be programmed.

Programming of the FIG. 3 cell is achieved by grounding the P-well and connecting the drain through a load resistance to the programming voltage. The source is connected to either the programming voltage or to ground depending upon whether a "1" or a "0" is to be stored. To initiate programming, the aluminum control gate is connected to the high voltage, if the source potential is also connected to the high voltage, then the internal access transistor doesn't turn on and the surface of the P-well below the floating gate is depleted of electrons. Only a small potential difference exists between the surface of the P-well and the floating gate. Therefore, no electrons tunnel into the gate and the cell remains in a 0 state. If the source terminal is connected to ground (to program a 1), then the internal access transistor turns on, the surface potential under the floating gate drops to close to 0 V, and electrons from the inversion layer tunnel through the thin oxide into the floating gate.

The FIG. 3 cell is erased by grounding the control gate and then raising the P-well to the programming voltage. This causes electrons to tunnel from the floating gate oxide to the P-well via the tunnel oxide. As electrons tunnel through the tunnel oxide, the floating gate acquires a net positive charge.

Although the FIG. 3 Shelton cell differs from the FIG. 1 FLOTOX cell in that it does not utilize a distinct access transistor, it does require an internal access transistor and, thus, also requires a relatively large cell size.

SUMMARY OF THE INVENTION

The present invention provides a high density, electrically-erasable programmable read only memory (EEPROM) cell and a method of fabricating the cell.

In accordance with a preferred embodiment of the invention, an electrically-erasable programmable read only memory (EEPROM) cell is fabricated by first forming first and second first field oxide (FOX1) regions in a P-well in an N-substrate to define a P-type active device region therebetween. Next, first and second buried N+ bit lines are formed in the P-well adjacent to the first and second FOX1 regions, respectively, such that the first and second bit lines define a P-type channel region therebetween. First and second second field oxide (FOX2) regions are then formed adjacent to the first and second FOX1 regions, respectively, and overlying the first and second buried N+ bit lines, respectively. Thus, the buried N+ bit lines are formed under the field oxide, thereby reducing the size of the cell. Next, a layer of gate oxide 300–500Å thick is formed on the P-well between the first and second FOX2 regions. A tunnel window is then defined in the gate oxide, the gate oxide is removed from the tunnel window and a thin tunnel oxide about 80–100Å thick is grown in the tunnel window. A first layer of polysilicon is then formed over the gate oxide, extending into the tunnel window over the tunnel oxide, to define the floating gate of the EEPROM cell. A layer of oxide/nitride/oxide (ONO) composite is then formed over the poly1 floating gate. Finally, a second layer of polysilicon and an overlying layer of tungsten silicide are formed over the ONO layer to define the control gate of the EPROM cell.

In accordance with one embodiment of the cell, the poly1 floating gate extends continuously over the entire P-type channel region. That is, in accordance with an aspect of the invention, the cell utilizes neither a distinct access transistor (as in the FLOTOX cell) nor an internal access transistor (as in the Shelton cell).

In a second embodiment of the cell, the poly1 floating gate is formed to extend over only a first portion of the P-type channel region such that the poly2 control gate is formed directly on the gate oxide overlying a second portion of the channel region to thereby define an internal access transistor of the cell. While this structure is similar to the Shelton cell, it differs from the Shelton design in that its buried N+ bit lines are formed under the field oxide and the gate of the internal access transistor is polysilicon rather than aluminum.

In accordance with another aspect of the invention, both embodiments of the above-described EEPROM cell are programmed by holding the control gate of the cell at a programming voltage, holding the first and second buried N+ bit lines at a low supply voltage, and holding the P-well at the low supply voltage. While maintaining the aforementioned conditions, the word line of adjacent EEPROM cells sharing the first and second N+ bit lines are held at the low supply voltage. Also, the first and second bit lines of adjacent cells sharing the same control line are held at the programming voltage. These conditions create an inversion layer of minority carriers in the channel, causing electrons to tunnel to the floating gate.

In accordance with another aspect of the present invention, both embodiments of the cell are erased by holding the control gate of the cell at a low supply voltage, holding the first and second N+ bit lines of the cell at a programming voltage, and holding the P-well at the programming voltage. While the above mentioned conditions are maintained, the first and second bit lines of adjacent EPROM cells sharing the same word line are held at the programming voltage. Furthermore, the word line of adjacent EPROM cells sharing the first and second bit lines is held at the programming voltage.

A better understanding of the features and advantages of the present invention will be obtained by reference to the following detailed description of the invention and accompanying drawings which set forth an illustrative embodiment in which the principals of the invention are utilized.

DETAILED DESCRIPTION OF THE INVENTION

FIGS. 4-7 illustrate the steps for fabricating a high density EEPROM cell in accordance with the present invention.

Figure 1:
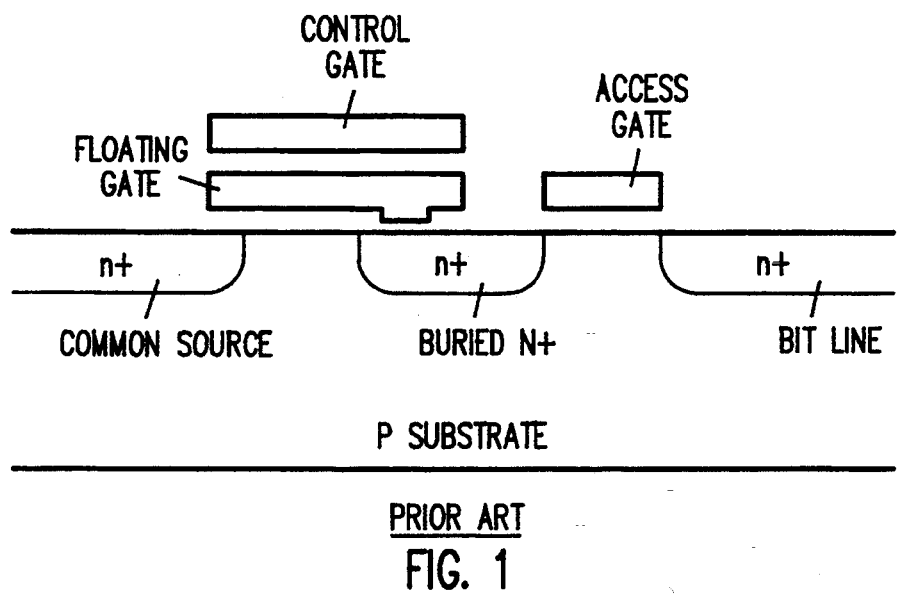
FIG. 1 is a cross-section drawing illustrating a conventional EEPROM cell structure that utilizes a distinct access transistor.
Figure 2:
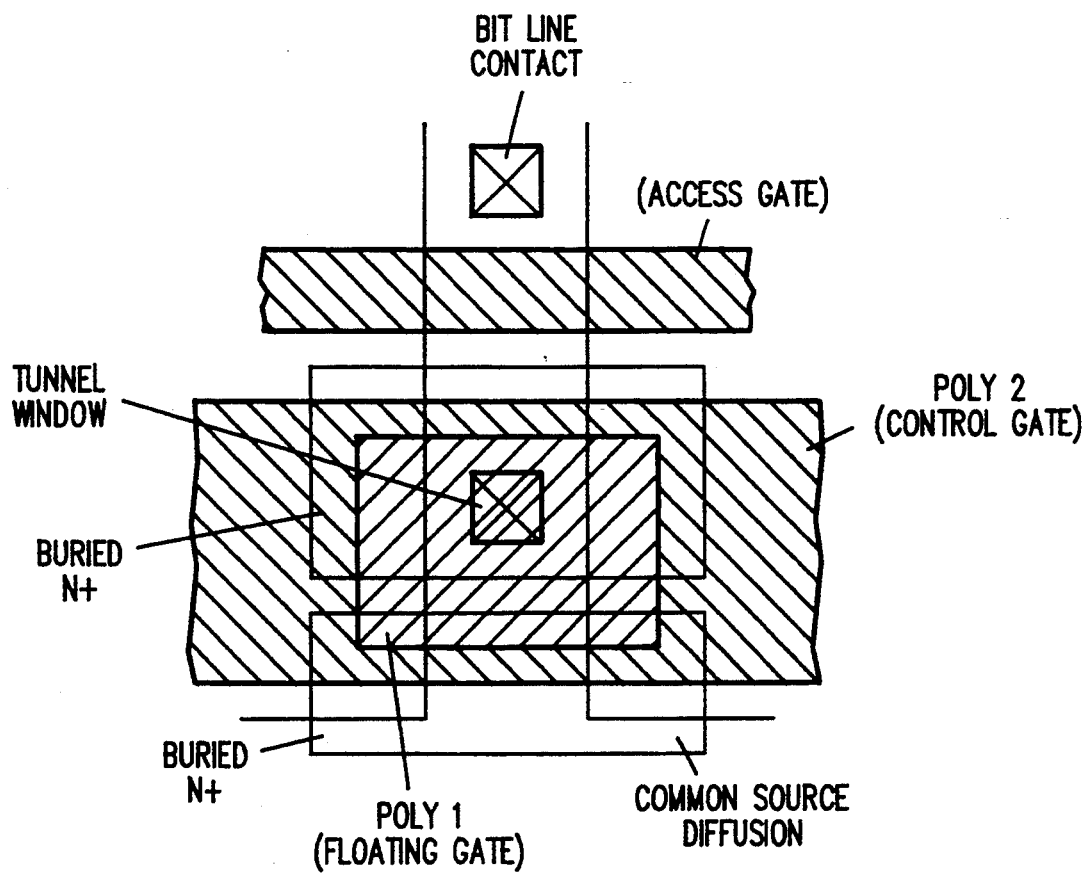
FIG. 2 is a layout illustrating the FIG. 1 cell structure.
Figure 3:
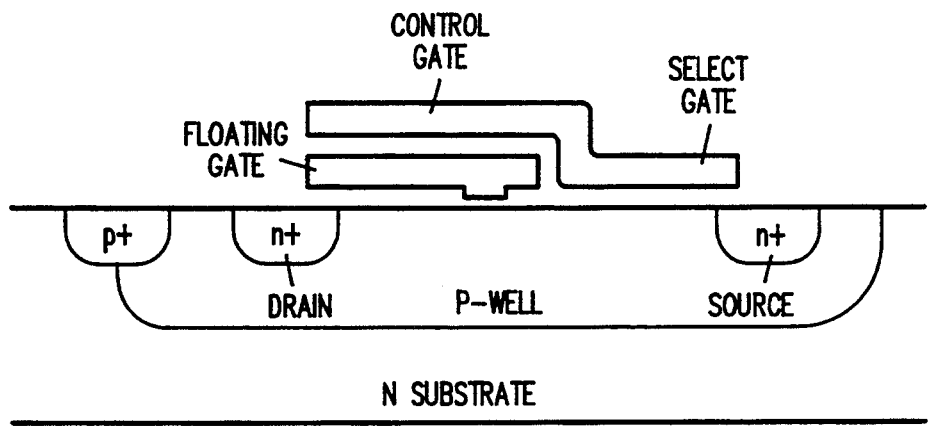
FIG. 3 is a cross-section drawing illustrating a prior art EEPROM cell that is fabricated on a P-well and utilizes an internal access transistor.
Figure 4:
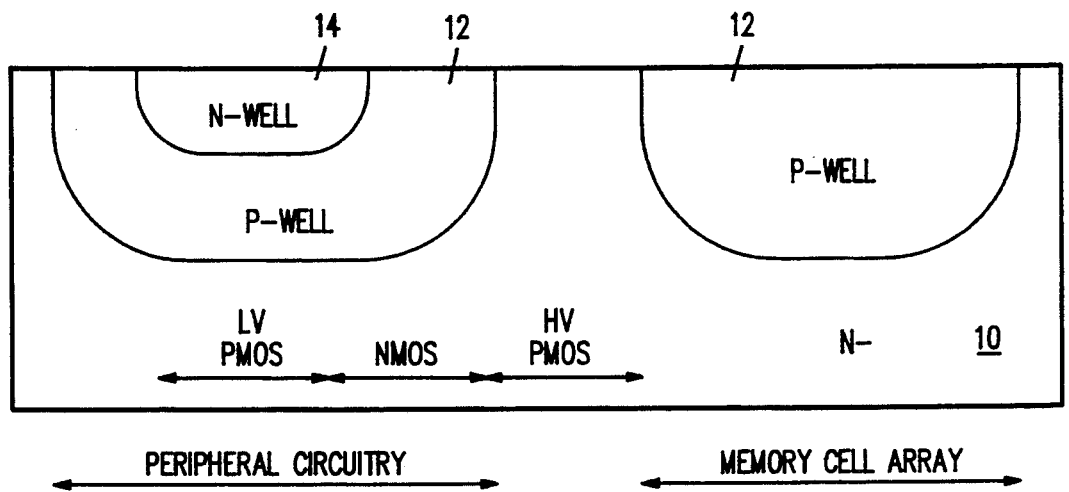
FIG. 4 is a cross-section drawing illustrating a triple-well structure utilizable in the fabrication of a high density EEPROM cell array in accordance with the present invention.

Referring to FIG. 4, the fabrication process begins with a silicon substrate 10 of N-type conductivity. In a conventional front-end process step, an initial oxide layer (not shown) is grown over the substrate 10. A photoresist mask is then formed over the initial oxide layer and patterned to define selected surface areas of the N-type substrate 10. The exposed surface areas are then implanted with a P-type dopant to form P-well regions 12 in the substrate 10. The photoresist mask is then stripped from the surface of the oxide and a thermal drive-in step is performed to further define the P-well regions 12.

The initial oxide layer is then removed from the substrate 10 and a second oxide layer (not shown) is grown over the substrate 12. The substrate 12 is again masked with photoresist, which is patterned to define substrate surface areas within those P-well regions 12 which will ultimately contain the peripheral circuitry for the EEPROM memory cell array. N-type dopant is implanted into the periphery P-wells 12 to define N-well regions 14. The photoresist is then stripped and a further drive-in step for both the N-well regions 14 and the P-well regions 12 is performed. Following the drive-in step, the second oxide layer is removed, resulting in the structure shown in FIG. 4.

Thus, the initial processing steps result in the formation of a triple-well structure which defines the substrate 10 for the formation of the EEPROM memory cell array and its peripheral circuitry. The N-well regions 14 in the periphery will be utilized for the fabrication of low voltage (LV) PMOS devices. The P-well regions 12 in the periphery will be utilized for the formation of NMOS devices for the peripheral circuitry. The P-well regions 12 in the memory cell array portion of the substrate 10 will be utilized for formation of EEPROM storage cell devices. The intermediate substrate region will be used for the formation of thigh voltage (HV) PMOS devices.

Figure 5:
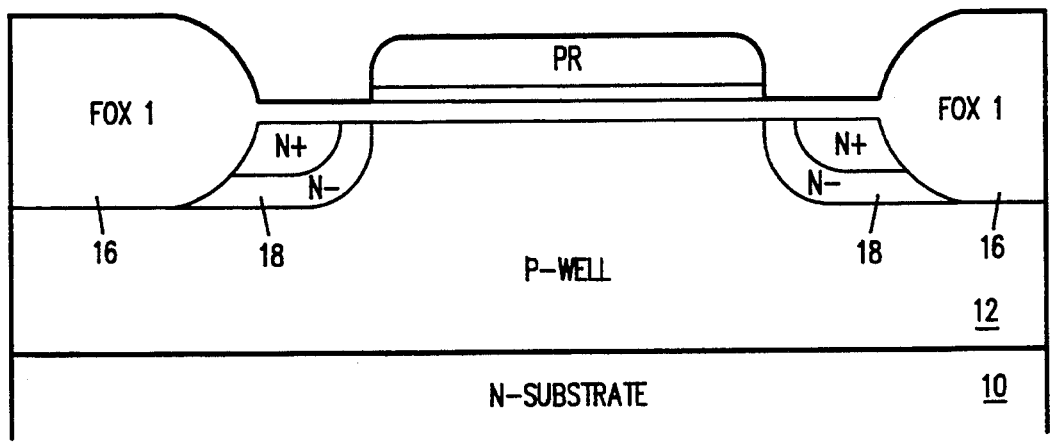
FIGS. 5-7 are cross-section drawings illustrating the fabrication of a high density EEPROM cell in accordance with the present invention.

Referring now to FIG. 5, after formation of the triple-well structure described above, conventional process techniques are utilized to define regions in the substrate 10 for formation of field oxide. That is, a pad oxide is first grown on the surface of the substrate 10, followed by deposition of an overlying nitride layer. The pad oxide/nitride composite is masked with photoresist, which is then patterned to expose regions of underlying nitride which will ultimately define first field oxide (FOX1) regions. The nitride is then etched, the photoresist is stripped and a P-type field implant is performed through the exposed pad oxide regions. The field implant mask is then stripped and first field oxide regions (FOX1) 16 are formed, as shown in FIG. 5.

Next, as further shown in FIG. 5, portions of the P-well regions 12 in the memory cell array are masked, the nitride/oxide composite is etched, and an arsenic implant is performed to define N+ buried bit lines 18 adjacent the FOX1 field oxide regions 16. Optionally, the arsenic implant can be followed by a phosphorous implant to form graded N+/N− bit lines, thereby optimizing resistance to avalanche breakdown during the erase of the EEPROM cells.

Figure 6:
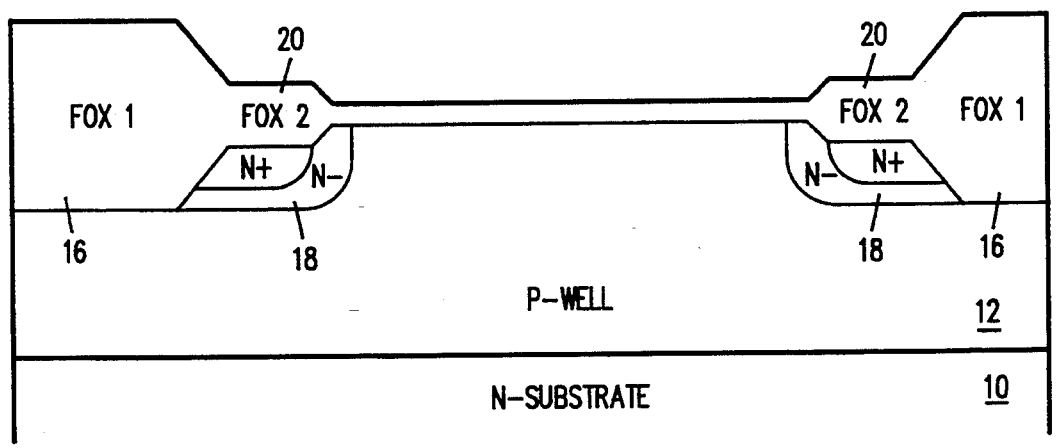

As shown in FIG. 6, the photoresist is then stripped and field oxide growth is completed by formation of second field oxide regions (FOX2) 20 over the N+/N− bit lines 18. Since the bit lines 18 are formed under the field oxide, the size of the device active region can be reduced, resulting in a reduced overall array size.

After completion of the field oxide growth, i.e. formation of FOX1 regions 16 and FOX2 regions 20, the oxide/nitride/oxide (ONO) layer is removed and a sacrificial oxide layer (not shown) is formed. A threshold voltage mask is then formed and patterned to expose the channel regions of the N-channel devices of the array. A threshold implant is then performed to characterize the threshold voltage of the storage cell transistors and the photoresist mask is stripped. Then the sacrificial oxide is removed.

Next, a gate oxide layer 22 about 300–500 Å thick is grown over the exposed portions of P-well region 12. A tunnel mask is then formed over the gate oxide 22 and patterned to define a tunnel window over the P-well 12. The tunnel window is then etched through to the surface of the underlying P-well 12. The tunnel mask is then stripped and tunnel oxide 24 about 80–100 Å thick is grown in the tunnel window. Next, a first layer 26 of polysilicon is deposited on the underlying oxide to a thickness of about 1500 Å and doped with phosphorous. The polysilicon (poly1) will serve as the floating gate for the EEPROM cells of the array. A composite dielectric layer 28 of oxide/nitride/oxide (ONO) is then formed on the poly1. After growing this ONO layer 28, a photoresist mask is used to define strips on the ONO.

The ONO/poly1 composite is then plasma etched to form parallel lines of ONO/poly1.

After stripping the photoresist from the poly1 mask, a thin edge oxide is grown on the sidewalls of the poly1 lines to provide insulation from subsequently-formed control gate conductive material.

Next, a protect array mask is formed over the memory cell array portion of the substrate 10 and device formation in the periphery proceeds.

First, oxide is etched from the substrate active device regions in the periphery and gate oxide is grown on the active device regions. A threshold mask is then formed and a P-type implant is performed to set the threshold of the peripheral MOS devices. The threshold photoresist mask is then stripped and processing begins to form both the word lines for the memory cell array and the gates for the MOS devices in the periphery.

That is, a second layer of polysilicon (poly2) is deposited over the surface of the entire device and doped in the conventional manner. This is followed by deposition of an overlying layer of tungsten silicide. The poly2/tungsten silicide composite is then masked and etched to define the word lines 30 in the storage cell array and the gate electrodes of the peripheral MOS devices, the word lines 30 running parallel to and overlying the ONO/poly1 lines in the array. The poly2 mask is then UV-hardened and a self-aligned etch (SAE) mask is formed. This is followed by a stacked etch of the poly1 floating gates 26 utilizing the overlying poly2 word lines 30 as a mask for the self-aligned etch of the ONO/poly1 composite.

The remaining photoresist is then stripped from the device and a sidewall seal oxidation step is performed on the devices in the peripheral region and for the poly1/poly2 stack in the array.

From this point, the process flow proceeds according to standard CMOS processing techniques with extra masks utilized for Forming the high voltage PMOS transistors in the N-substrate between the periphery and the storage cell array. The resulting cell structure is shown in FIG. 7.

Figure 7:
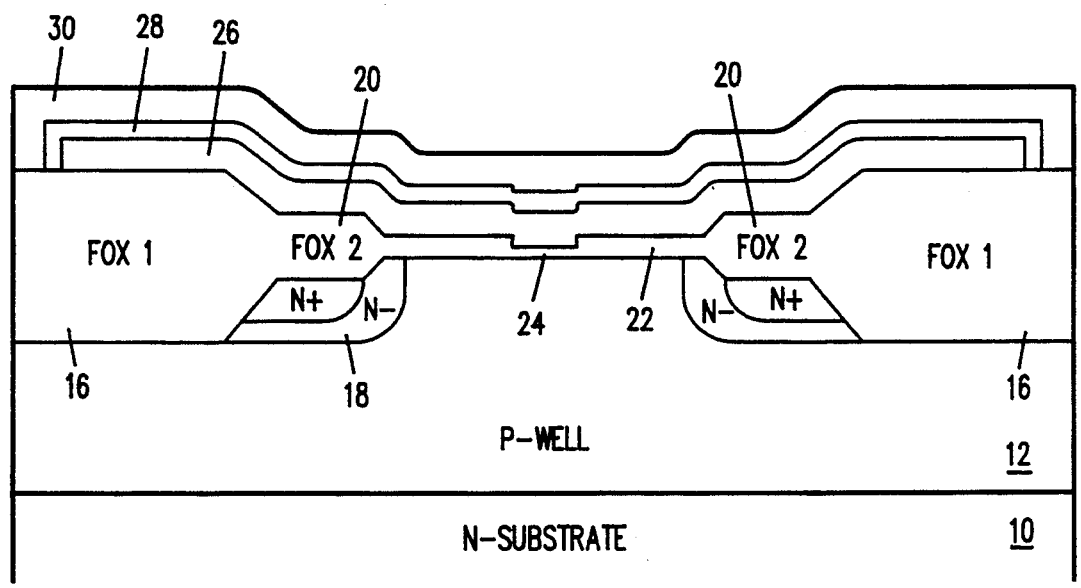
Figure 8:
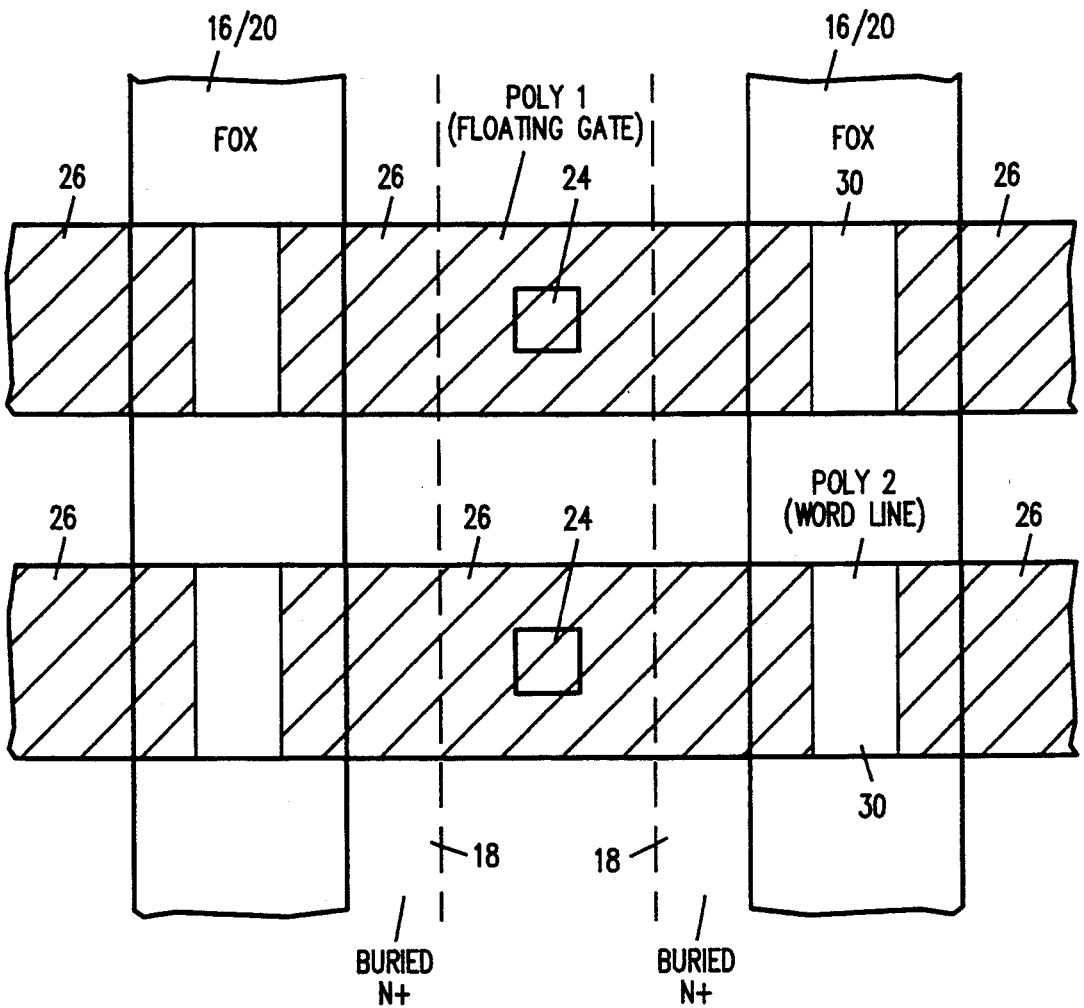
FIG. 8 is a layout illustrating the FIG. 7 cell structure.

A corresponding layout off the FIG. 7 cell is shown in FIG. 8, with the FIG. 7 cross section being taken along a word line 30 in the FIG. 8 layout.

Figure 9:
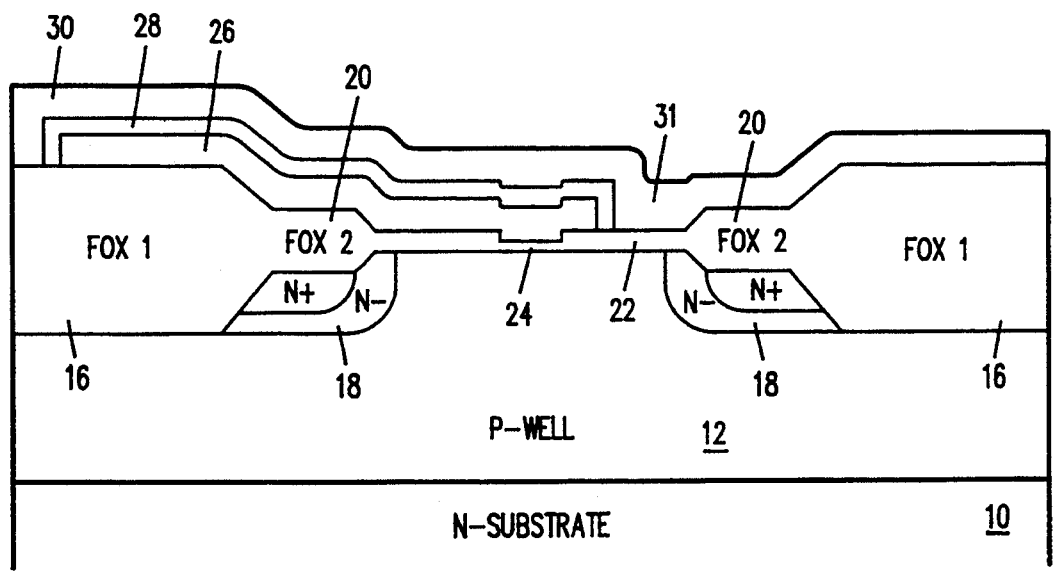
FIG. 9 is a cross-section drawing illustrating an alternative embodiment of a high density EEPROM cell in accordance with the present invention.

FIG. 9 illustrates a cross section of an alternative embodiment of a EEPROM memory cell in accordance with the present invention wherein the poly1 floating gate 26 is truncated over the P-well region 12 between N+ buried bit lines 18. Thus, the overlying poly2 word line 30 forms the gate 31 of an internal access transistor in a manner similar to the Shelton cell described above. However, because of the advantages provided by the processing techniques described above, the FIG. 9 cell is smaller than the Shelton cell and utilizes a poly2 access gate rather than an aluminum gate.

Figure 10:
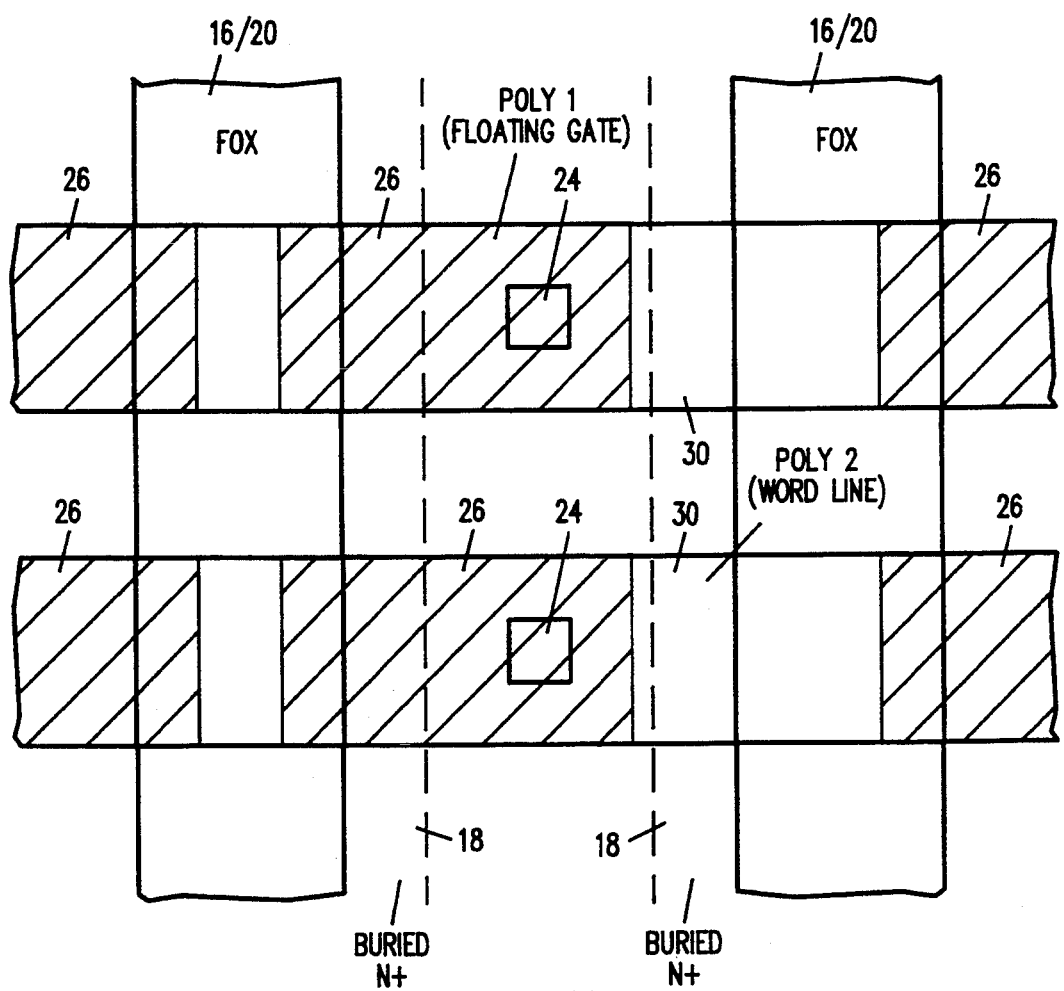
FIG. 10 is a layout illustrating the FIG. 9 cell structure.

A layout of the cell shown in FIG. 9 is provided in FIG. 10, the FIG. 9 cross-section being taken along a word line 30 in the FIG. 10 layout.

Although the cell shown in FIGS. 7 and 8 eliminates the access transistor typically utilized in EEPROM cells, it is, thus, susceptible to overerase, resulting in read disturb problems. Therefore, the FIG. 7/8 embodiment may require a special erase algorithm to prevent over-erase. For example, the erase operation could be allowed to proceed for some specified time period, e.g. 10 $\mu$sec, after which the threshold voltage $V_T$ of each cell in the array is read. If the threshold voltage $V_T$ of any cell in the array is less a specified value, e.g. 1.2 V, then the erase procedure is terminated. If the threshold voltage of all cells remains above 1.2 V, then another timed erase iteration is performed.

As stated above, the FIG. 9/10 embodiment includes a select transistor to address the overerase problem, but requires greater overall cell area to do so.

In both embodiments of the invention, the resulting array relies on a novel compact cell that does not require a separate access transistor. Furthermore, as stated above, in both embodiments, the buried N+ regions do not define the storage transistor channel which, rather, is self-aligned with the field oxide, particularly the FOX2 second field oxide region 20, thereby further reducing cell size.

Figure 11:
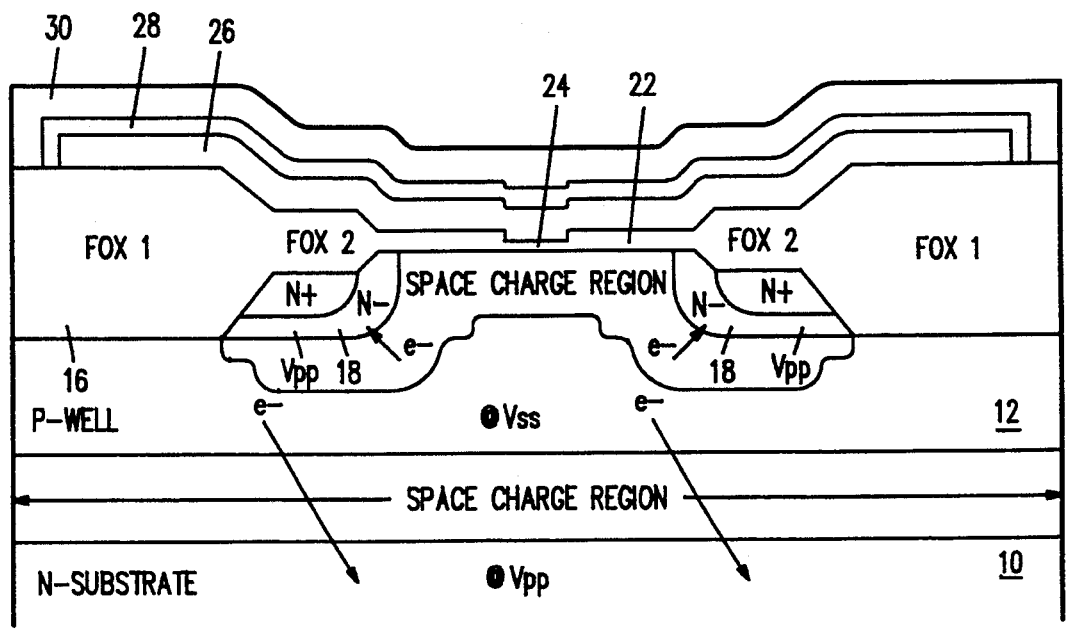
FIG. 11 is a cross-section drawing illustrating program inhibit conditions in the FIG. 7/8 and FIG. 8/9 cells during programming.

Table 1 provides a novel programming scheme for both the FIG. 7/8 and FIG. 9/10 embodiments of the invention. In accordance with another aspect of the present invention, and as shown in FIG. 11, the Table I program inhibit scheme addresses deep depletion during programming by causing any minority carriers (i.e. electrons) thermally generated in the P-well 12 or in the space charge regions to be "sucked up" by the N−/P− well and N+ bit line/P-well reversed bias junctions.

TABLE 1

|  | Source | Drain | Control Gate | P-Well | N-Sub |
|---|---|---|---|---|---|
| Write | $V_{ss}$ | $V_{ss}$ | $V_{pp}$ | $V_{ss}$ | $V_{pp}$ |
| WL Write Inhibit | $V_{pp}$ | $V_{pp}$ | $V_{pp}$ | $V_{ss}$ | $V_{pp}$ |
| BL Write Inhibit | $V_{ss}$ | $V_{ss}$ | $V_{ss}$ | $V_{ss}$ | $V_{pp}$ |
| Erase | $V_{pp}$ | $V_{pp}$ | $V_{ss}$ | $V_{pp}$ | $V_{pp}$ |
| BL Erase Inhibit | $V_{pp}$ | $V_{pp}$ | $V_{pp}$ | $V_{pp}$ | $V_{pp}$ |
| Read | $V_{ss}$ | $V_{read}$ | $V_{cc}$ | $V_{ss}$ | $V_{cc}$ |

More specifically, with reference to FIG. 12, the programming conditions, are as follows. To program cell A, word line WL1 is held at the programming voltage $V_{pp}$. Bit line $BL_n$, and bit line $BL_{n1}$ are held at the low supply voltage $V_{ss}$. The P-well is also held at $V_{ss}$. This creates an inversion layer of minority carriers in the channel, causing electrons to tunnel to the floating gate.

During this operation, cell C is program-inhibited by holding word line WL2 at $V_{ss}$, bit line $BL_n$ and $BL_{n1}$ at $V_{ss}$ and the P-well at $V_{ss}$. Furthermore, cell B is program inhibited by holding wordline WL1 at $V_{pp}$ and raising bit line $BL_{n+1}$ and $BL_{n'+1}$ to the programming voltage, while the P-well is held at $V_{ss}$. This avoids the occurrence of any minority carriers at the P-well surface under the floating gate; the only minority carrier generation is thermal and all of these electrons are evacuated from the P-well 12 by the bit line/P-well and N-/P-well reverse bias junctions.

Figure 12:
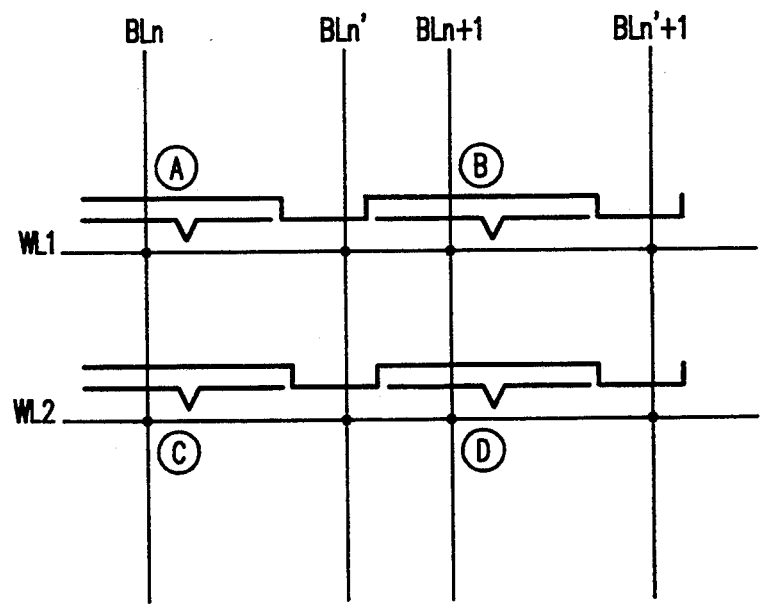
FIG. 12 is a schematic diagram illustrating a portion of a high density EEPROM cell array in accordance with the present invention.

With continuing reference to FIG. 12, in accordance with another aspect of the present invention, the erase conditions for the above-described cell are as follows. To erase cell A and its associated byte or word line, word line WL1 is held at $V_{ss}$ while bit lines $BL_n$ and $B_{Ln}$, and $B_{Ln+1}$ and $B_{Ln'+1}$, as well as the P-well, are held at the programming voltage $V_{pp}$. During this operation, cell C is erase inhibited by holding word line WL2 at the programming voltage.

It should be understood that various alternatives to the embodiments of the invention described herein may be employed in practicing the invention. It is intended that the following claims define the scope of the inven-

What is claimed:

1. A method of fabricating an electrically-erasable programmable read only memory (EEPROM) cell in semiconductor material of P-type conductivity, wherein the P-type semiconductor material is a well of P-type conductivity formed in a silicon substrate of N-type conductivity, the method comprising:

forming first and second spaced-apart first field oxide (FOX1) regions in the P-type semiconductor material to define a P-type active device region therebetween;

forming first and second spaced-apart bit lines of N-type conductivity in the P-type semiconductor material adjacent to the first and second FOX1 regions, respectively, such that the first and second bit lines define a P-type channel region therebetween;

forming first and second spaced-apart second field oxide (FOX2) regions adjacent to the first and second FOX1 regions, respectively, and overlying the first and second bit lines, respectively;

forming a layer of gate dielectric material on the P-type semiconductor material between the first and second FOX2 regions;

defining a window of tunnel dielectric material in the gate dielectric material over the P-type semiconductor material such that the thickness of the tunnel dielectric material is less than the thickness of the gate dielectric material;

forming a layer of first conductive material over the gate dielectric material, and extending into the tunnel window over the tunnel dielectric material, to define a floating gate of the EEPROM cell;

forming a layer of intermediate dielectric material over the floating gate; and forming a layer of second conductive material over the layer of intermediate dielectric material to define a control gate of the EEPROM cell.

2. A method as in claim 1 wherein the layer of first conductive material is formed to extend continuously over the entire P-type channel region.

3. A method as in claim 1 wherein the layer of first conductive material is formed to extend over only a first portion of the P-type channel region such that the layer of second conductive material is formed directly on the gate dielectric material overlying a second portion of the channel region to thereby define the gate of an internal access transistor of the EEPROM cell.

4. A method as in claim 1 wherein the gate dielectric material and the tunnel dielectric material comprise silicon dioxide.

5. A method as in claim 4 wherein the first conductive material comprises polysilicon.

6. A method as in claim 5 wherein the intermediate dielectric material comprises an oxide/nitride/oxide composite.

7. A method as in claim 6 wherein the second conductive material comprises polysilicon.

8. A method as in claim 6 wherein the second conductive material comprises polysilicon and overlying tungsten silicide.

9. An electrically-erasable programmable read only memory (EEPROM) cell formed in semiconductor material of P-type conductivity, wherein the P-type semiconductor material is a well of P-type conductivity formed in silicon substrate of N-type conductivity, the EEPROM cell comprising:

first and second spaced-apart first field oxide (FOX1) regions formed in the P-type semiconductor material to define a P-type active device region therebetween;

first and second space-apart bit lines of N-type conductivity formed in the P-type semiconductor material adjacent to the first and second FOX1 regions, respectively, such that the first and second bit lines define a P-type channel region therebetween;

first and second spaced-apart second field oxide (FOX2) regions formed adjacent to the first and second FOX1 regions, respectively, and overlying the first and second bit lines, respectively;

a layer of gate dielectric material formed on the P-type semiconductor material between the first and second FOX2 regions and having a window of tunnel dielectric material formed therein over the P-type semiconductor material such that the thickness of the tunnel dielectric material is less than the thickness of the gate dielectric material;

a layer of first conductive material formed over the gate dielectric material, and extending into the tunnel window over the tunnel dielectric material, to define a floating gate of the EEPROM cell;

a layer of intermediate dielectric material formed over the floating gate; and a layer of second conductive material formed over the intermediate dielectric material to define a control gate of the EEPROM cell.

10. An EEPROM cell as in claim 9 wherein the layer of first conductive material extends continuously over the entire P-type channel region, 11. An EEPROM as in claim 9 wherein the layer of first conductive material extends over only a first portion of the P-type channel region such that the layer of second conductive material is formed directly on the gate dielectric material overlying a second portion of the channel region to thereby define an internal access gate of the EEPROM cell, 12. An EEPROM cell as in claim 11 wherein the gate dielectric material and the tunnel dielectric material comprise silicon dioxide.

13. An EEPROM cell as in claim 12 wherein the first conductive material comprises polysilicon.

14. An EEPROM cell as in claim 13 wherein the intermediate dielectric material comprises oxide/nitride/oxide composite.

15. An EEPROM cell as in claim 14 wherein the second conductive material comprises polysilicon.

16. An EEPROM cell as in claim 14 wherein the second conductive material comprises polysilicon and overlying tungsten silicide.

17. A method of programing an electrically erasable read only memory (EEPROM) cell, wherein the EEPROM cell includes first and second spaced-apart first field oxide regions formed in a P-type semiconductor material to define a P-type active device region therebetween, first and second spaced-apart bit lines of N-type conductivity formed in the P-type semiconductor material adjacent to the first and second spaced-apart first field oxide regions, respectively, such that the first and second bit lines define a P-type channel region therebetween, first and second spaced-apart second field oxide regions formed adjacent to the first and second spaced-apart first field oxide regions, respectively, and overlying the first and second bit lines, respectively, a layer of gate dielectric material formed on the P-type semiconductor material between the first and second spaced-apart second field oxide regions and having a window of tunnel dielectric material formed therein over the P-type semiconductor material such that the thickness of the tunnel dielectric material is less than the thickness of the gate dielectric material, a layer of first conductive material formed over the gate dielectric material, and extending into the tunnel window over the tunnel dielectric material, to define a floating gate of the EEPROM cell, a layer of intermediate dielectric material formed over the floating gate, and a layer of second conductive material formed over the intermediate dielectric material to define a control gate of the EEPROM cell, the method comprising:

holding the control gate of the EEPROM cell at a programming voltage;

holding the first and second bit lines at a low supply voltage;

holding the P-type semiconductor material at the low supply voltage;

while maintaining the conditions set forth in the foregoing steps, holding the control gate of adjacent EEPROM cells sharing the first and second bit lines at the low supply voltage; and while maintaining the conditions set forth in the foregoing steps, holding the first and second bit lines of adjacent EEPROM cells sharing the same control gate line at the programming voltage.

18. A method of erasing an electrically erasable read only memory (EEPROM) cell, wherein the EEPROM cell includes first and second spaced-apart first field oxide regions formed in a P-type semiconductor material to define a P-type active device region there between, first and second spaced-apart bit lines of N-type conductivity formed in the P-type semiconductor material adjacent to the first and second spaced-apart first field oxide regions, respectively, such that the first and second bit lines define a P-type channel region therebetween, first and second spaced-apart second field oxide regions formed adjacent to the first and second spaced-apart first field oxide regions, respectively, and overlying the first and second bit lines, respectively, a layer of gate dielectric material formed on the P-type semiconductor material between the first and second spaced-apart second field oxide regions and having a window of tunnel dielectric material formed therein over the P-type semiconductor material such that the thickness of the tunnel dielectric material is less than the thickness of the gate dielectric material, a layer of first conductive material formed over the gate dielectric material, and extending into the tunnel window over the tunnel dielectric material, to define a floating gate of the EEPROM cell, a layer of intermediate dielectric material formed over the floating gate, and a layer of second conductive material formed over the intermediate dielectric material to define a control gate of the EEPROM cell, the method comprising:

holding the control gate of the EEPROM cell at a low supply voltage;

holding the first and second bit lines of the EEPROM cell at a programming voltage;

holding the P-type semiconductor material at the programming voltage;

while maintaining the conditions set forth in the foregoing steps, holding the first and second bit lines of adjacent EEPROM cells sharing the same control gate line at the programming voltage; and while maintaining the conditions set forth in the foregoing steps, holding the control gate of adjacent EEPROM cells sharing the first and second bit lines at the programming voltage.

* * * * *